TOOLING ARRANGEMENT FOR INSTALLING CHANNEL FLANGED EYELETS IN PRINTED CIRCUIT BOARDS

Original Filed June 15, 1961 4 Sheets-Sheet 1

INVENTOR.
JOSEPH D. KELLER
BY
Julian C. Renfro
ATTOR.

TOOLING ARRANGEMENT FOR INSTALLING CHANNEL FLANGED EYELETS IN PRINTED CIRCUIT BOARDS

Original Filed June 15, 1961 4 Sheets-Sheet 2

INVENTOR.
JOSEPH D. KELLER
BY
Julian C. Renfro
ATTOR.

INVENTOR.
JOSEPH D. KELLER
BY
Julian C. Renfro
ATTOR.

May 16, 1967 J. D. KELLER 3,319,324

TOOLING ARRANGEMENT FOR INSTALLING CHANNEL FLANGED EYELETS IN PRINTED CIRCUIT BOARDS

Original Filed June 15, 1961 4 Sheets-Sheet 4

INVENTOR.
JOSEPH D. KELLER
BY
Julian C. Renfro
ATTOR.

3,319,324
Patented May 16, 1967

3,319,324

TOOLING ARRANGEMENT FOR INSTALLING CHANNEL FLANGED EYELETS IN PRINTED CIRCUIT BOARDS

Joseph D. Keller, Winter Park, Fla., assignor to Martin-Marietta Corporation, a corporation of Maryland Original application June 15, 1961, Ser. No. 117,435, now Patent No. 3,190,953, dated Nov. 5, 1963. Divided and this application Jan. 29, 1965, Ser. No. 440,655
20 Claims. (Cl. 29—203)

This invention is a division of my application entitled, "Channel Flanged Capillary Eyelet for Printed Circuit Boards," filed June 15, 1961, Ser. No. 117,435, now Patent No. 3,190,953. Whereas that invention taught and claimed a novel capillary eyelet configuration, the present invention teaches the novel tooling arrangement whereby my novel eyelets can be readily and effectively installed in suitable apertures in printed circuit boards.

In the past printed circuit boards have enjoyed much popularity due to the great weight saving over ordinary circuits as well as the considerable labor saver in the construction of a given piece of circuitry. However, many double-sided printed circuitry utilizations have been plagued with problems surrounding the proper soldering of components to the circuit board, for in many instances discontinuities such as hairline cracks or solder separation develop with respect to the eyelets used to connect the upper and lower circuitries, thus preventing a proper solder joint from being created.

The use of such double-sided printed circuit boards presents a particularly severe problem, for many occasions arise in which the circuit on one side of the board must be properly connected to a circuit on the other side of the board, and "plated through holes," as well as certain eyelet configurations have been proposed to establish a proper connection between the circuits disposed on opposite sides of the board. However, each of these has proven to be quite unreliable, due to the many processing variables necessarily involved.

According to the present invention I have evolved a procedure for modifying eyelets, such as a standard funnel flanged eyelet so that when properly installed on a circuit board it will have a plurality of "petals" or "leaves" on the component side of the circuit board, which petals have channels therebetween. Each of these petals is formed from a portion of the basic eyelet, and by virtue of being bent over into close proximity to the circuit board, serve as a repository for flux. When the side of the circuit board opposite the components and petals is dipped into molten solder, the solder tends to flow upwardly through the barrel or opening of the eyelet, to the upper surface of the circuit board. There the molten solder encounters the entrapped flux residing in the channels and under the petals, and as a result of the surface tension of the solder thereby being greatly reduced, the solder promptly passes through channels between the petals and because of additional capillary action created by the juxtaposed petal and the top surface of the circuit board, flows in considerable quantity to form an ample fillet of solder between the eyelet, the circuit of the circuit board, and a component lead that may be placed in the barrel of the eyelet.

Not only does the cutting of the channels create petals that serve as repositories for flux, but also the solder located in these channels forms an electrical path from the circuitry on one side of a double-sided circuit board directly to the circuit on the other side of the circuit board, this being an electrical path independent of the eyelet. This of course means that even if the eyelet is badly oxidized, there will still be no intermittent or high resistant circuit formed inasmuch as the electrical path is from one end of a column of solder to the other, with each end of such column being directly in contact with its respective circuitry. Although in most instances the eyelet need be configured to have petals only on one end, it is within the spirit of my invention to form petals on both ends thereof in the event that the circuit board is of a universal type in which either side could be dipped in solder, or if it be necessary to create channels to assure an electrical path for each end of the eyelet by virtue of solder disposed in such channels.

The tooling arrangement for establishing a hollow flanged eyelet in the proper position in a hole in a circuit board or the like comprises upper and lower members disposed in substantial alignment, the upper member being equipped with a needle and movable portion slidably disposed upon the needle. The needle is dimensioned to extend inside an eyelet and to move the eyelet into the proper hole of a circuit board. The movable portion of the upper member then pushes the eyelet off the needle and into the proper hole of the circuit board with the lower member having guide means thereon to extend up into the hole and guide the eyelet into the proper position in the circuit board.

The movable portion of the upper member then continues its movement so as to force the flange of the eyelet into firm contact with the upper surface of the circuit board, whereas the lower member has a flared portion thereon adapted to spread the lower portion of the eyelet and thereby mechanically lock it in the circuit board. The creation of petals on the eyelet is contemporaneously carried out by virtue of there being on either or both the upper and lower members means for cutting channels thereby to create from the eyelet a plurality of petal shaped portions, which are bent over into close proximity to the near surface of the circuit board, thereby to serve as repositories for flux to be of assistance during soldering.

A method of obtaining through connections for double-sided printed circuit board utilizing the aforementioned eyelets comprises the steps of placing an eyelet in a hole in the circuit board, applying force to the eyelet so as to bring about the crimping of the eyelet in the hole while substantially contemporaneously creating at one end of the eyelet a plurality of channels so as to form petals to entrap quantities of flux, applying flux to the petal end of the eyelet, immersing the opposite end of the eyelet in molten solder so that solder can flow through the hollow central portion of the eyelet and thence through the channels formed between said petals, this entrapment of flux lessening surface tension of the solder and because of its abundance being floated upon the surface of the solder flowing through the eyelet to prevent oxidation of the solder.

The foregoing means for cutting the channels in the eyelet preferably involves the use of an elongated tool having blades disposed in spaced relation about the end of the tool so as to act upon the appropriate end of the eyelet. These blades may have cutting edges perpendicular to the center line of the eyelet, or alternatively these edges may slope upwardly so as to present cutting edges that extend somewhat into the end of the eyelet being acted upon. If desired the blades may be removable.

It is therefore a principal object of this invention to provide a novel tooling arrangement by the use of which hollow eyelets can be placed and fastened in appropriate holes in printed circuit boards or the like, with such tooling functioning to contemporaneously create a plurality of petals in at least one end of the eyelet to serve as a repository for flux, and subsequently for molten solder.

These and other objects, features, and advantages of this invention will be apparent after the study of the enclosed drawings of which:

Figure 1:
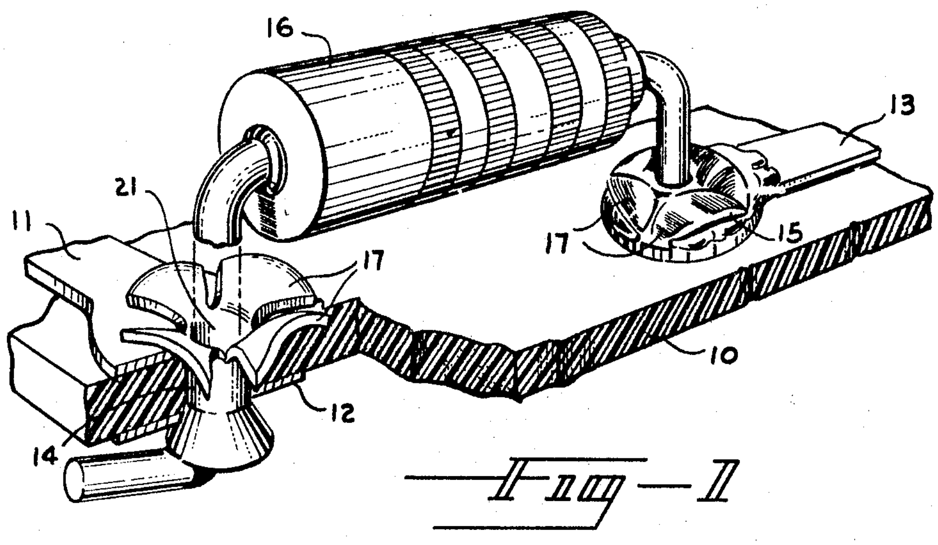
FIGURE 1 is a perspective view partly in section revealing significant details surrounding the soldering of a component into channel flanged eyelets according to this invention.

Referring to FIGURE 1, a circuit board 10 is there illustrated, upon the surface of which conductors 11, 12 and 13 have been disposed according to present day printed circuitry techniques. In this figure the thickness of these conductors is exaggerated for clarity. Eyelets 14 and 15 are disposed in spaced relation on the circuit board, with the leads of a component 16 such as a resistor shown extending through these eyelets in such a manner that upon the circuit board being subjected to a proper soldering operation, the component leads will be soldered to the eyelet and each eyelet in turn soldered to the conductor or conductors of the circuit board. These eyelets are usually copper or brass and coated with solder, tin, gold or other appropriate metal. I prefer the use of funnel flanged eyelets such as furnished by Atlas Tack Corporation.

My invention obviates the severe shortcomings of the prior art by providing sufficient solder in the proper state and in the proper location in order to properly secure these several elements together. By forming the upper end of each eyelet so as to create a plurality of petals or leaves 17 (with varying degree of curvature) that reside in the proper relation to the surface of the circuit board, not only are the eyelets mechanically secured in position, but also, more importantly, a small pocket or repository is formed under each petal 17, in which the flux applied during a fluxing operation can reside. This ample supply of flux not only serves to clean the metallic surfaces, but also wets the solder in a desirable manner so as to break the surface tension and thereby bring about a much wider dissemination of solder than would otherwise be possible. It should be noted that the well-soldered joint depicted on the right side of FIGURE 1 did not need to be soldered from above or by hand, but rather was achieved solely by virtue of a dip soldering or flow soldering operation in which only the lower surface of the circuit board was immersed in a pool of molten solder. The flow of solder upwardly through the barrel 21 of the eyelet takes place by virtue of capillary attraction, despite the presence or absence of a component lead in the eyelet.

An additional advantage brought about by the utilization of the petals 17 to serve as a repository for flux is that the flux, being lighter than the solder, tends to float on top of the molten solder and protect it from the atmosphere, thus preventing oxidation and consequent degrading of the solder joint.

Another advantage of the channel eyelet is that the electrical connection from the bottom side of the circuit board to the top side is independent of the eyelet in that if a badly oxidized eyelet is used, the channels on the component side of the board, being filled with solder, will complete the circuitry. With the electrical path being independent of the eyelet, a still further advantage manifests itself in that the intermittent electrical joints and/or high resistance electrical joints are eliminated since any interfacial conditions are now of no consequence.

Still another advantage relatable to the copious flux supply is that the surface tension of the solder with time at temperature is controlled or reduced, which allows movements of the eyelet relative to the conductor to occur, without rupturing the solder fillet upon solder solidification; movements are appreciable due to the differential coefficient of expansion existing within the composite circuit board materials; for example, the circuit board may be made of reinforced plastic whereas the eyelet may be of copper.

Although I have mentioned that a dip soldering operation can be used, it should be noted that I am in no manner to be limited thereto, for it is well within the scope of my invention to employ any of several hand methods or other conventional automatic techniques such as wave soldering and the like in order to bring about the soldering operation. Also, it is within the scope of my invention to employ an electrically conductive flowable material such as conductive plastic instead of solder.

Figure 2:
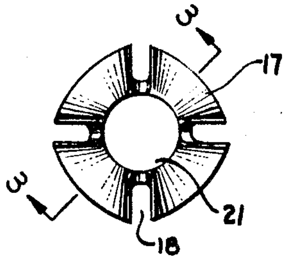
FIGURE 2 is a plan view of the petal configuration of a typical eyelet having parallel channels between the petals.

As depicted by FIGURES 2 through 7, any of several eyelet configurations can be employed within the spirit of my invention. For example, as shown in FIGURE 2, four petals 17 may be employed with channels or radial slots 18 located therebetween, through which channels the molten solder flowing upwardly through the barrel 21 can flow in order to reach the under surface of the petals 17.

Figure 3:
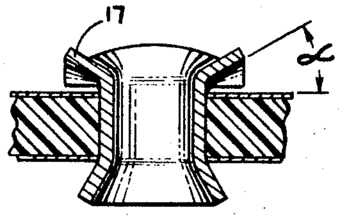
FIGURE 3 is a cross sectional view taken along section 3—3 in FIGURE 2 and revealing the configuration of the upper and lower eyelet ends.

As illustrated in FIGURES 2 and 3, these petals 17 may be of somewhat curved configuration, with the edge portions of the petals adjacent the channels being substantially parallel to but spaced from the upper conductor 11 of the circuit board, but with the mid portion of the leaves disposed at an angle $\alpha$ with respect to the surface, which angle could vary over a wide range between the vertical and the horizontal depending upon the amount of bonding fillet desired.

Figure 4:
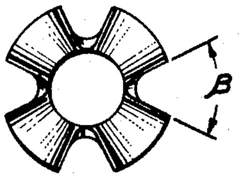
FIGURE 4 is a plan view of another petal configuration, revealing how the petal edges can be non-parallel if desired.

As will be observed from FIGURE 4, the channels between the petals can be other than parallel, in this instance being disposed at a substantial angle $\beta$ with respect to the adjacent petal if such be desired. This wide channel may be created by deliberate design, although I have found in the prolonged use of the cutting tools hereinafter described that the resultant wear of the tool tips tends to create the type of channel shown in FIGURE 4 rather than precisely parallel channels shown in FIGURE 2.

Figure 6:
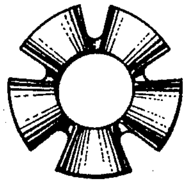
FIGURE 6 is a plan view revealing the versatility of the present petal arrangement, illustrating in this instance that five or more petals may be used if desired.
Figure 5:
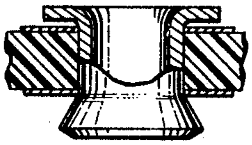
FIGURE 5 is a cross sectional view revealing how the petals of the eyelet of either FIGURE 2 or FIGURE 4 can be formed to be spaced from but substantially parallel to the surface of the circuit board.

As illustrated in FIGURE 5, I am not to be limited to leaves or leaves or petals that are curved, for as shown in this figure these petals may be substantially parallel to the upper surface of the circuit board and spaced several thousandths of an inch therefrom. This spacing is desired, although for certain materials it is not as rigorously necessary for an adequate space to be maintained as is the case with other materials. It is not a requisite that the solder flow between the petals and the upper surface of the circuit board in order for a solder joint to be formed, for the solder existing in the channels can suffice, but it is highly desirable for solder to flow between the leaves and the circuit board in instances in which vibration or other severe loadings will be present. As shown in FIGURE 6, five or more leaves may be created if desired, whereas in other applications less than four channels may be preferred.

Figure 7:
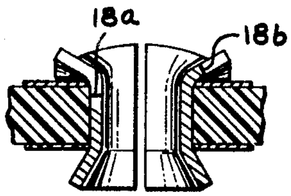
FIGURE 7 is a view revealing two different channel configurations, one of which is of greater depth than the other.

The leaf configuration revealed in FIGURE 7 illustrates another variable of this invention that may be taken into account depending upon the materials used to form the bond and the type of joint being created. In this figure, the channel **18*a* is shown residing somewhat below the lowermost portion of the petals, so in this instance the extreme lower portion of the channel would actually reside below the surface of the circuit board. For example, this deep channel configuration would typically be employed if the soldering material or bonding material being worked with is exceedingly viscous. The bonding material may be of conductive plastic, as previously mentioned, and more specifically may be a filled epoxy. However, I am not to be limited to the deep channel configuration, for in some instances the channel can actually reside above the surface of the circuit board as shown at 18*b*** in FIGURE 7, this configuration being occasioned by the use of a highly fluid material, which in some instances should be "dammed" back. Typically, the channel is no more than $\frac{1}{32}''$ above or below the surface of the circuit board.

Referring now to FIGURE 3, the height of the solder joints there illustrated reveals the ample supply of solder that according to this invention is obtained in a contoured manner on the upper surface of a circuit board. This abundance but without excess is obtained merely by virtue of dipping the lower surface of the board in a pool of molten solder, and the capillary attraction created by the present configuration brings about this remarkable joint formation. The solder tends to take the shape of the lead-petal-conductor configuration, so that adequate bonding is obtained with minimum solder quantity, thereby facilitating inspection and preventing the potential hiding of flaws, such as pinholes and nonbonded areas. As to the bottom side of the circuit board, the lower portion of each eyelet is encased with solder due to the dip soldering operation. The results achieved in FIGURE 8 of course presuppose the use of the preliminary technique of bending the component leads to conform to the eyelet spacing, the insertion of the leads for the approximate proper depth into the eyelets, as well as the clipping and bending of the leads on the under surface of the board so that these ends can properly reside against the lower edge of the eyelet or against the conductor as may be preferred. As should be obvious, the body of the component can touch the circuit board, or be spaced therefrom as shown.

Figures 8, 9, 10, 11, 12, 13:
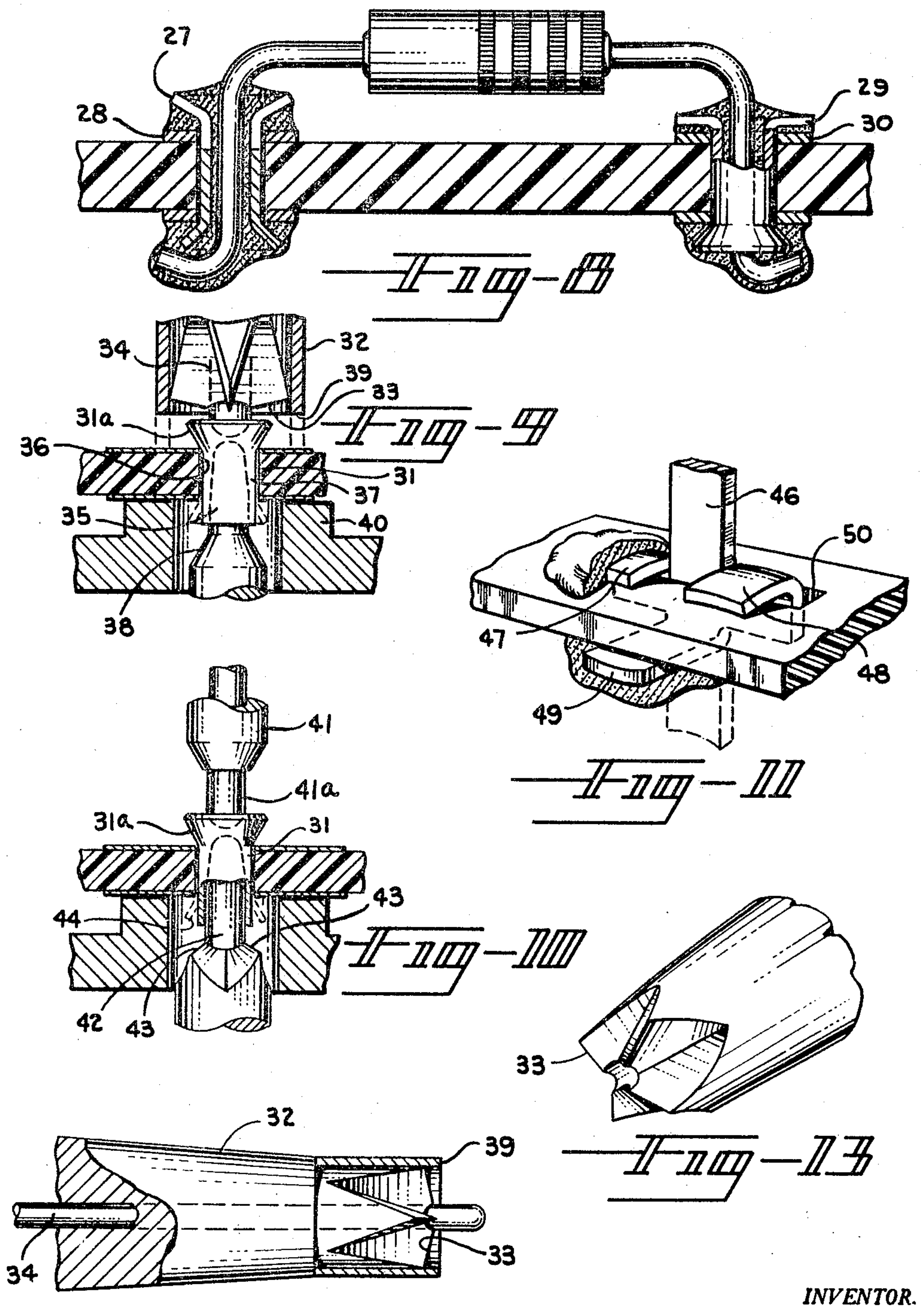
FIGURE 8 is a cross sectional view revealing how the two ends of a component can be soldered to a circuit board by the use of eyelets of various configuration, in this instance the petal angle being different in the two eyelets used.
FIGURE 9 is a cutaway view revealing details of the eyelet-cutting tool relationship just before the creation of petals on the funnel end of an eyelet, and the installation of the eyelet in a circuit board.
FIGURE 10 is a view similar to FIGURE 9, but involving the creation of petals on the barrel end of an eyelet.
FIGURE 11 represents an adaptation for other than eyelet use.
FIGURE 12 is a side elevation view, partly in section, of a tool such as may be employed in the installation of an eyelet in the circuit board in order to properly configure the petals during the installation procedure.
FIGURE 13 is a perspective view of the tip of the tool similar to that of FIGURE 12, in which a surrounding ring about the cutting edges is not used.

As was revealed in FIGURE 8, the petals can be spaced to different extents with respect to the upper conductor of the circuit board in accordance with the demand of the particular circumstances. For example, the petals 27 may be disposed at a substantial angle to the upper conductor 28, or the petals 29 for example may be disposed closely adjacent to conductor 30, the decision in each instance depending upon the several factors such as viscosity, materials employed, tool design, fillet size, usage intended for the circuit board and the like, as previously discussed.

The figures of drawing heretofore discussed reveal eyelet configurations obtained in accordance with the forming technique illustrated in FIGURE 9. In this figure a standard eyelet 31 is shown, this eyelet being the standard funnel flanged eyelet widely used in industry. Many techniques are presently in use by which the eyelets are automatically inserted into appropriate holes in the circuit board, but such techniques are not involved in this invention. Rather, the present invention comprehends the use of a cutting tool 32 whose sharp edges 33 are utilized for configuring the eyelet so as to have the desired number, shape, and depth of petals in order to achieve a preferred configuration for the use intended. The details of this tool are illustrated in FIGURES 12 and 13. The cutting edges of the tool may vary in lead angle so as to provide an additional feature such as cutting below the top surface of the printed circuit hole without damaging the edge of the printed circuit hole.

A needle 34 is slidably located in a hollow central portion of cutting tool 32, and this needle is used to transfer eyelets from an eyelet track into position over the hole 36 in the circuit board. This is a well-known technique employed in eyeleting machines such as manufactured by the Edward Segal Company, of New York, N.Y. After the needle has removed an eyelet from the track, the needle and the cutting tool move downwardly simultaneously until such time as the needle 34 is in alignment with and in close proximity to the pilot-anvil 35 disposed within the hole 36 in accordance with the normal operation of the automatic machine. At this point the downward movement of the needle stops and the cutting tool 32 continues downwardly with respect to the now stationary needle 34, thus forcing the eyelet off the needle and allowing it to drop onto the pilot-anvil 35 and enter the hole 36. At this point the eyelet is correctly disposed in hole 36 and located in such a manner that it can now be properly incorporated into the circuit board 10. The eyelet is then supported in the hole by virtue of its preformed funnel **31*a* resting around the periphery of the hole 36**.

As a result of continued downward movement of the cutting tool 32, the cutting edges 33 now cut through the preformed funnel **31*a*** to form a petal configuration and channels of one of the types hereinbefore described which is used for the passage and retention of solder or other bonding material. With still further downward travel the hole within the cutting tool travels just past the tip of the pilot-anvil. At this time, additional configuring of the petals, or final sizing can be obtained by virtue of a coining surface approximately located between the cutting edges or cutting blades according to this invention, if such is desired.

Since it is usually desirable to mechanically secure the eyelet in the circuit board, the tool 32 is arranged to have a certain amount of overtravel. During the final portion of the downward stroke or overtravel period of the cutting tool, the board assembly is forced downwardly against a spring loaded stripper plate 40 causing the barrel portion 37 of the eyelet to be forced over the tapered portion 38 of the anvil which causes the bottom or barrel portion of the eyelet to be flared out to such an extent as to securely retain the eyelet in the circuit board. The flared configuration is shown by the dotted lines in FIG- URE 9. The stripper plate typically has a raised portion to enable the bottom of eyelets located elsewhere on the circuit board to clear the main portion of the stripper plate. Thus the cutting of channels is generally followed by flaring, the precise sequencing depending upon the spring tension employed upon the stripper plate.

If desired the cutting tool 32 may be furnished with an encircling pressure ring 39 disposed about its cutting edges, this ring typically extending approximately .001 of an inch below or beyond the cutting edges 33. Accordingly, when the ring has come into contact with the circuit board as seen in dotted lines in FIGURE 9, it will facilitate the downward movement of the circuit board against the spring-loaded stripper plate so that the flaring operation can be accomplished without undue distortion of the edge of the hole in the circuit board due to the action of the cutting edges. As will be apparent, the ring 39 could be spaced in a different relationship to the cutting edges than the aforementioned .001 if desired, the placement of the ring being dependent on the angle of the cutting edges and blades of the cutting tool. Depending upon the depth of channel to be cut, either a tool having the ring spaced as desired is selected, or else an adjustable tool may be used, with the end of the tool being threaded to receive a threaded pressure ring selected to give the spacing desired.

An alternate technique for forming channels according to this invention may be accomplished by replacing the above described cutting tool with an off shelf setting cap 41 as shown in FIGURE 10 which device is also manufactured by the Edward Segal Company. The same type stripper plate is still used. In this instance, the setting cap is also equipped with a needle 41*a* of the type shown in FIGURE 9, but the anvil 42 according to this invention contains cutting edges 43 which are designed to act against the barrel portion of the eyelet.

This cutting action is brought about during the overtravel of the setting tool 41 with respect to needle 41*a*, with the result being that the funnel flanged portion 31*a* of the eyelet is left intact whereas a part of the barrel portion is separated into petals 44, such as four in number, of a modified type. More particularly, the petals formed by this latter arrangement are of substantially less curved configuration than the petals created from the preformed funnel portion of the eyelet according to the arrangement of FIGURE 9.

It should be noted that this petal creating arrangement involves considerably less tool wear than is present in the device illustrated in FIGURE 9. However, because of the structure of the petals 44, they will contain a lesser amount of flux than is possible under petals 17, but such petals may be entirely satisfactory when very viscous soldering or bonding material is employed since a wider channel between petals results.

The procedure described with regard to FIGURE 10 involves the circuit board in effect being placed "upside down" so that the eyeleting procedure can be followed as previously described. After the eyelet has been properly set, it is the pre-funneled side of the circuit board that is dipped into solder or bonding material and the petals 44 formed from the eyelet barrel will as in the previous instance be on the component side of the circuit board. This procedure, however, is not the preferred method, for the method outlined with respect to FIGURE 9 has the advantage of greater mechanical strength due to the formed petal configuration as well as superior filleting capabilities with respect to the petal, bonding material and printed conductor or equivalent. It should be noted that with respect to the setting cap of FIGURE 10 and the anvil or pilot used in FIGURE 9, both are state of the art. Neither in FIGURE 9 nor 10 does the upper needle ever touch the pilot-anvil, for at the extreme downward movement of the cutting tool or setting cap the pilot-anvil protrudes above the top surface of the circuit board and into the hole in the cutting tool or setting cap, with the needle being spaced slightly therefrom at all times. The setting cap, like the cutting tool, is responsible for downward movement, and as the funnel portion of the eyelet nests firmly against the edge of the hole in the circuit board, the eyelet and board is depressed and cutting and flaring of the petals is performed.

It may be desirable to configure the petals on both ends of the eyelet, in which event I employ cutting edges top and bottom, or in other words, I substitute the lower member 42, 43 of FIGURE 10 in place of the lower member of FIGURE 9. In this instance the two cutting members move to act upon the ends of the eyelet as described with regard to the operation of FIGURE 9.

Figures 14, 15:
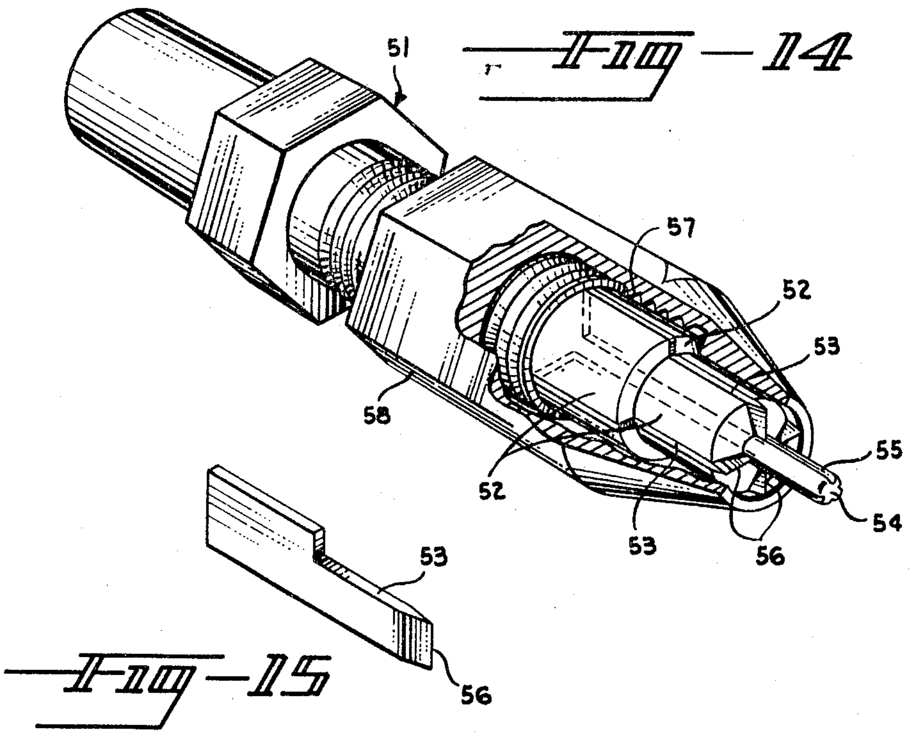
FIGURE 14 is a perspective view of a cutting tool according to this invention, in which is employed removable blades slidably disposed with respect to a splined needle.
FIGURE 15 is a view of a typical blade used in tool of FIGURE 14.

As another embodiment of my invention, I propose the use of certain other cutting tool and needle modifications to insure the cutting of channels to the proper depth. As shown in FIGURE 14, I provide a basic tool member 51 having a blade-holding or shank portion 52 containing for example four equally spaced slots therein designed to receive an equal number of separate blades 53. These blades, which are of somewhat L-shaped configuration, are disposed in such a manner as to be in sliding contact with the needle 54 at all times. A plurality of longitudinally disposed grooves 55 are cut or otherwise formed in the needle 54 in a space coinciding with the slots in the shank portion 52. The blades in turn are of a dimension that a portion thereof actually extends into grooves 55 and moves along them as the cutting edges 56 are moved with respect to the needle. Because of this construction, the cutting edges 56 of the blades can actually extend somewhat into the inside portion of the eyelet as to perform the desired cutting operation upon the eyelet, thus controlling channel depth.

Preferably I utilize blades 53 made of high quality tool steel of proper hardness and heat treat which can be used for many eyeleting operations. However, I preferably make these blades removable so that the basic blade holder can be utilized when blades require replacement. The cutting edges of FIGURES 14 and 15 are shown to be perpendicular to the axis or centerline of the tool although other angles of cutting edge relative to tool centerline may be used.

The blade-holding portion 52 of tool 51 is provided with threads 57 to receive a threaded retaining member 53, which has a central hole therein of a dimension to closely conform to the dimension of the shank portion 52 of the tool 51. Because of this construction, as the member 53 is screwed tightly upon the shank portion, the blades are caused to be tightly gripped in the holder preventing an undesired dislodging thereof.

Figure 16:
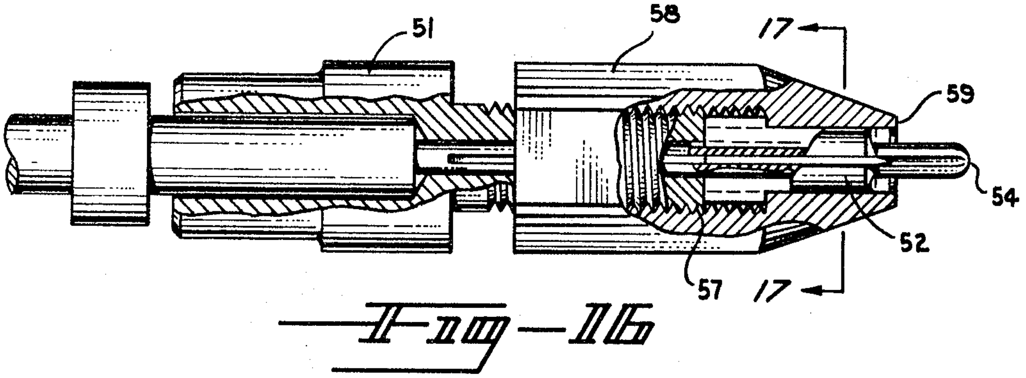
FIGURE 16 is a side elevational view, partly in section to reveal detail.
Figure 17:
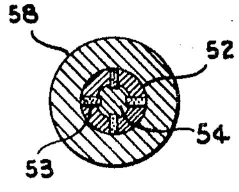
FIGURE 17 is a cross sectional view taken along lines 17—17 in FIGURE 16 to reveal the cutting edges interfitting with blade holder and needle.

As mentioned with regard to the earlier embodiment, it is preferable that the edge of the retainer, in this case 59, be properly disposed with respect to the cutting edges 56, the preferable arrangement being that the cutting edges are recessed. By changing the relationship of retainer edge and cutting blades, or by utilizing blades of particular length, width and cutting angle, different eyelet effects may be obtained. The section of 52 between the blades 53 is shown in FIGURE 16 to be machined in such a manner as to offer no restraint to petals formed by the tool. This section can, however, be machined so as to coin or otherwise alter the petal configuration, and for instance can be used to create petals that are somewhat corrugated.

In certain applications and requirements, the cutting edges 33 may be as shown in FIGURE 12 or else may be essentially square to the center line or axis of the cutting tool as hereinbefore mentioned. In order to acquire the desired petal configuration, cutting and shearing may be initiated from the inside or outside of the eyelet surface and cutting and shearing may even be accomplished with a tool similar to FIGURE 14 wherein the cutting edges engage a splined needle, for example, to assure thorough channel configurating despite the fact that the inside opening of the commercially-obtained eyelet may vary.

Several factors may need to be taken into consideration in the selection of the method to be employed for forming the eyelets in place on the circuit board. For example, the petals formed according to the standard technique shown in FIGURE 9 results in petals having large flux-containing ability preferred for certain embodiments requiring large amounts of flux. The method according to FIGURE 10 has the advantage that the cutting tool does not tend to wear as rapidly, although the petals formed by this method have less shape.

FIGURE 11 illustrates an embodiment of my invention pertaining to the use of components having tabs rather than ordinary leads of substantially circular cross section. As noted from this figure, the component is attached to the central upstanding lead 46 with adjacent curved or flat leads 47 and 48 disposed alongside to rest against the upper surface of the component board. The lower lead 49 is initially inserted through a slot 50 in the circuit board while in the extended position shown in dotted lines, but then upon the then curved or flat tabs being properly positioned with the circuit board, the lower tab is bent over into the full line position shown.

By virtue of each of the tabs 47, 48 and 49 being of somewhat curved cross section as shown in FIGURE 11, each serves as a location for the entrapment of flux applied during a fluxing operation. Then, upon the circuit board being dip soldered, molten solder is caused to flow up through slot 50 along the several tabs and to flow out upon the upper surface of the circuit board as shown in FIGURE 11.

While the invention is primarily directed to bonding an eyelet to a printed wire or circuit panel with some liquid material such as molten solder, I am not to be limited to this application or to solder material. Preplacement of solder or bonding material such as paste or preforms for example could be used utilizing the channels for distribution purposes or thermal contact functions. The eyelet as herein discussed may be of various configurations with or without surface openings through which solder may flow in order to increase bonding area and to compensate for contaminated surfaces that quite frequently occur during the time the eyelets are tumbled within the cannister of the aforementioned Segal eyeletting machines. The eyelet may be of consumable material so that it will melt and merge with the bonding material after its purpose has been served.

Although the emphasis of my invention is directed toward the use of an eyelet for double-sided printed circuitry, it is possible to use such an eyelet in instances in which the eyelet is not relied upon to provide circuitry connections, but rather only to provide a firm mechanical support for a component. In such instances, a ring of copper may be created by usual printed circuitry techniques about the periphery of the side of the hole opposite the components so that the eyelet can be firmly soldered in place and thereby furnish a column of solder for the support of the component. Alternatively, the ring of copper can be on the same side as the component, with the component being primarily secured to the circuitry on the opposite side of the printed circuit board.

Figures 18, 19:
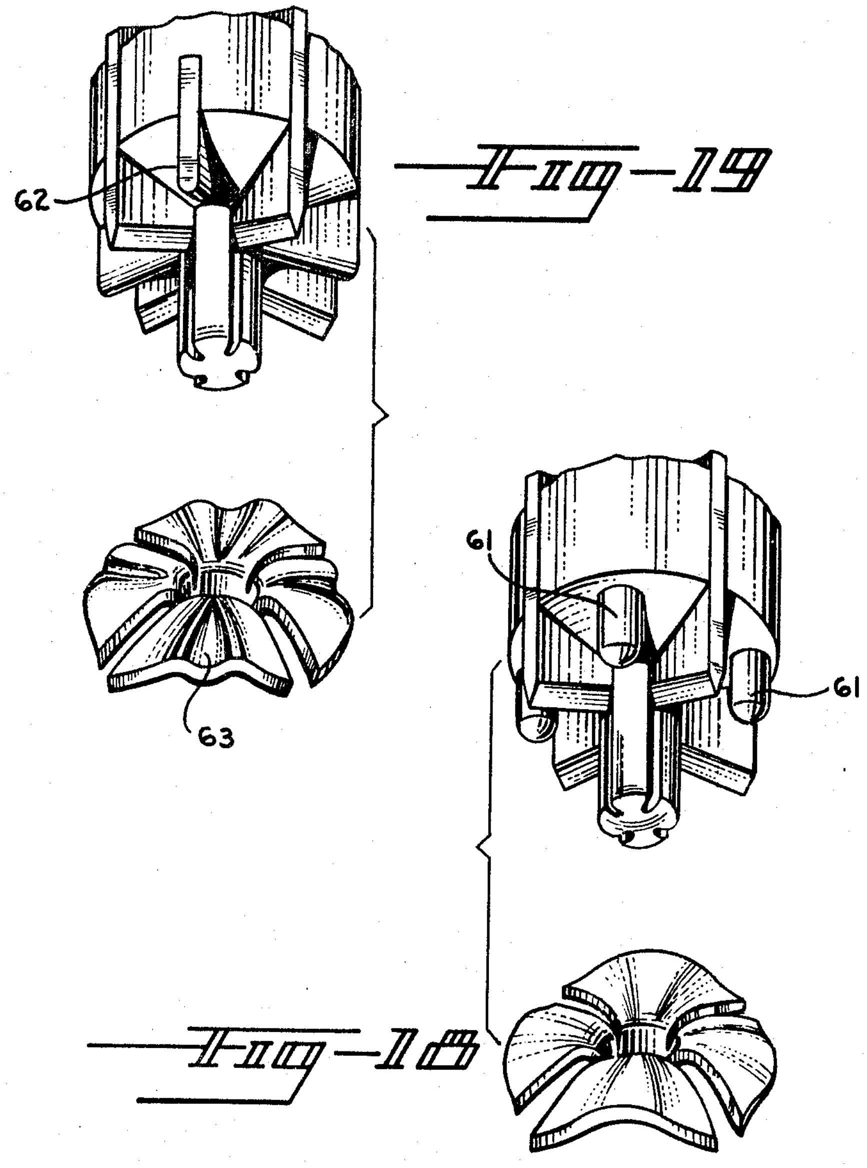
FIGURE 18 is a perspective view showing a modified cutting tool arrangement utilizing petal-spacing pins, in conjunction with the resulting petal formation.
FIGURE 19 is a perspective view similar to FIGURE 18 revealing a cutting tool having coining members thereon for bringing about a contoured petal.

In certain instances it may be important to utilize cutting tools designed not only to cut channels in the eyelet so as to form petals, but also to coin or otherwise act upon these petals by means of protrusions intermediate the cutting blades so as to bring about and insure a certain spacing between the underside of the petal and the respective side of the circuit board, or so as to coin the petals into a desired configuration. As shown in FIGURE 18, an embodiment of this invention is illustrated wherein a plurality of coining members in the form of pins 61 are disposed between the cutting blades. As seen in the corresponding petal formation also illustrated in this figure, the pins cause the petals to move into a desired spacing relationship with the circuit board.

As shown in FIGURE 19, coining members may be disposed intermediate the blades of the cutter in the form of comparatively dull and foreshortened blade-like members 62 that act upon the midportion of the petals so as to bring about a cupping or deflection of each petal that causes the petals to take on additional rigidity.

Although my invention is primarily directed to the use of eyelets for circuit board utilization, it is within the spirit of my invention to use petalled eyelets for structural purposes. For example, it may be desirable to install an eyelet in a hole in a surface in which the accessibility of hole is only from one side of the surface. The eyelets used can be precut or prescored. An expandable mandrel can be used for pushing the petal portions of the eyelet apart so as to dispose them about the back side of the hole. Then, upon flowable material being inserted through the hollow portion of the eyelet, the material flows through the channels between the petals and thence under the petals so as to securely locate the eyelet in the surface.

Other embodiments within the spirit of this invention will become apparent to those skilled in this art, and all embodiments that come within the scope or range of equivalency of the appended claims are intended to be included therein.

I claim:

1. A tooling arrangement for establishing a hollow eyelet in proper electrical position in a hole in a circuit board or the like comprising opposed locating and setting means disposed in substantial alignment and relatively movable to act against an eyelet to set it in a hole in a circuit board, said locating means being adapted to extend through the hole in which the eyelet is to be placed, one of said opposed means having relatively movable inner and outer portions, with said outer portion being movable along said inner portion to force the eyelet into contact with the other of said opposed means, at least one of said opposed means being equipped with a plurality of blades thereon for cutting channels in one end of said eyelet so as to form a plurality of petals therein during the setting operation, and means for spreading said eyelet so as to mechanically lock it in position in said circuit board.

2. The tooling arrangement as defined in claim 1 in which said blades are disposed on the side of the circuit board opposite said locating means.

3. The tooling arrangement as defined in claim 1 in which said blades are located upon said locating means.

4. The tooling arrangement as defined in claim 1 in which blades are located on both said locating means as well as said setting means, thereby to form petals on each end of said eyelet.

5. A tooling arrangement for establishing a hollow flanged eyelet in the proper position in a hole in a circuit board or the like comprising upper and lower members disposed in substantial alignment, said upper member being equipped with a needle, and a movable portion disposed in slidable relation upon said needle, said needle being dimensioned to extend inside an eyelet and move it into the proper hole of the circuit board, said movable portion, upon being moved along said needle, being arranged to push said eyelet off the needle and into the proper hole, said lower member having guide means adapted to extend upwardly through that hole and guide the eyelet to the proper position in said circuit board, said movable portion then continuing its movement so as to force the flange of said eyelet into firm contact with the upper surface of said circuit board, said lower member having a flared portion adapted to spread the lower portion of said eyelet during downward movement of said movable portion and thereby mechanically lock it in said circuit board, and means on one of said members for cutting channels into at least one end of said eyelet so as to create a plurality of petal shaped portions of the eyelet which are bent over into close proximity to the near surface of the circuit board thereby to serve as repositories for flux to be of assistance during soldering.

6. The tooling arrangement as defined in claim 5 in which said cutting means are disposed upon the upper member, which means are operative to configure the flanged portion of said eyelet into petals.

7. The tooling arrangement as defined in claim 5 in which said cutting means are disposed upon said lower member and adapted to configure the lower portion of said eyelet into petals, said upper member serving to hold said flanged portion of said eyelet in close proximity of said circuit board during said configuring.

8. The tooling arrangement as defined in claim 5 in which said cutting means are disposed upon both said upper and said lower members.

9. A tool for configuring the flanged portion of a funnel flanged eyelet into petals for the retention of flux during the soldering of a hollow eyelet to a circuit board comprising an elongated blade holding member, and an elongated needle centrally disposed in said blade holding member, with respect to which latter member is movable, said blade holding member having a plurality of spaced slots therein, a blade for each of said slots, said blades having cutting surfaces thereon for cutting the end of a hollow eyelet, said central needle having a plurality of longitudinal slots disposed in alignment with said blades, into which a portion of the respective blades interfit said cutting surfaces being radially spaced about said needle, whereby said blades can move closely along said needle during a petal-creating operation, thereby preventing a gap between said blades and said needle.

10. The tool as defined in claim 9 in which said blades are removable, and whose cutting surfaces are disposed at an angle to the center line of said tool.

11. The tool as defined in claim 9 in which said blades have cutting surfaces which are disposed at right angles to said needle.

12. A tool for configuring one end of a flanged eyelet into petals for the retention of material used to secure the eyelet to a supporting surface, comprising an elongated blade supporting member, a plurality of cutting surfaces disposed in spaced relation about one end of said member, and a central member disposed in said blade supporting member and extending therefrom, about which central member said cutting surfaces are arrayed, said central member being dimensioned to extend inside an eyelet and move it into a hole in the supporting surface, said cutting surfaces being movable along said central member and arranged to cut channels in the adjacent end of the eyelet in so doing.

13. The tool as defined in claim 12 in which said cutting surfaces are disposed substantially perpendicular to said central member.

14. The tool as defined in claim 12 in which said cutting surfaces are disposed at an angle to said central member.

15. A tool for configuring an end of a flanged eyelet into petals for the retention of material used to secure the eyelet to a supporting surface, said tool comprising an elongated blade supporting member, a plurality of cutting surfaces disposed in spaced relation about one end of said member, coining members located intermediate said cutting surfaces, and means for forcing said cutting surfaces against an end portion of the eyelet, said cutting surfaces serving to cut the end of the eyelet to form petals, and said coining members acting upon each petal to control petal configuration.

16. The tool as defined in claim 15 wherein said coining members are in the form of pin-like members for bringing about the desired spacing of petals from the supporting surface.

17. The tool as defined in claim 15 wherein said coining members are in the form of dull, blade-like members for creasing the petals to bring about additional rigidity.

18. A tooling arrangement for establishing and fastening a hollow eyelet in the proper position in a hole in a circuit board or the like comprising relatively movable first and second members disposed in substantial alignment in opposed relation, said members being movable from a spaced-apart relationship into an eyelet-compressing relationship in which they are closely adjacent, said first member comprising two portions, an inner and an outer portion, with said outer portion being arranged to be slidable along said inner portion, said inner portion being dimensioned to extend inside an eyelet, said outer portion being dimensioned to contact one end of the eyelet disposed upon said inner portion, said inner portion being adapted to move the eyelet into position in a hole in which it is to be established, said second member at that time being disposed in abutting spaced relationship with said inner portion of said first member, said second member having thereon a flared portion adapted to come into forcible contact with the other end of said eyelet, so as to spread the eyelet during movement of said outer portion along the inner portion of said first member in the direction toward said second member, thus to lock the eyelet in the hole in the circuit board, and means on one of said members for cutting channels into at least one end of the eyelet so as to create a plurality of petal-shaped portions on the eyelet, which are bent over into close proximity to the near surface of the circuit board.

19. The tooling arrangement as defined in claim 18 in which said outer portion of said first member is equipped with cutting means operative to configure the adjacent end of the eyelet into petals.

20. The tooling arrangement as defined in claim 18 in which said cutting means are disposed upon said second member and adapted to configure the adjacent portion of the eyelet into petals during said forcible contact.

References Cited by the Examiner

UNITED STATES PATENTS

| | | | |
|---|---|---|---|
| 1,900,099 | 3/1933 | Ferguson | 29—155.55 |
| 2,296,983 | 9/1942 | Cooper et al. | 29—203 |
| 2,439,465 | 4/1948 | Gookin | 29—203 |
| 2,454,326 | 11/1948 | Makenny | 339—220 |
| 2,464,405 | 3/1949 | Knauf | 29—155.55 |
| 2,760,195 | 8/1956 | Berg | 29—203 |
| 3,106,436 | 10/1963 | Weiss | 29—513 X |
| 3,148,438 | 9/1964 | Winter et al. | 29—155.5 |
| 3,159,906 | 12/1964 | Telfer | 29—155.5 |
| 3,190,953 | 6/1965 | Keller | 29—155.5 X |

JOHN F. CAMPBELL, *Primary Examiner.*

THOMAS H. EAGER, CHARLIE T. MOON, *Examiners.*

R. W. CHURCH, *Assistant Examiner.*